United States Patent
Hwang

(10) Patent No.: US 8,116,160 B2
(45) Date of Patent: Feb. 14, 2012

(54) METHODS OF DETECTING A SHIFT IN THE THRESHOLD VOLTAGE FOR A NONVOLATILE MEMORY CELL

(75) Inventor: Sangwon Hwang, Gyeonggi-do (KR)

(73) Assignee: Samsung Eelctronics Co., Ltd., Gyeonggi-do (KR)

( * ) Notice: Subject to any disclaimer, the term of this patent is extended or adjusted under 35 U.S.C. 154(b) by 402 days.

(21) Appl. No.: 12/495,546

(22) Filed: Jun. 30, 2009

(65) Prior Publication Data
US 2010/0008151 A1    Jan. 14, 2010

(30) Foreign Application Priority Data

Jul. 9, 2008    (KR) .................. 10-2008-0066541

(51) Int. Cl.
*G11C 7/04*    (2006.01)

(52) U.S. Cl. ............... 365/211; 365/185.22; 365/210.11

(58) Field of Classification Search ............ 365/211, 365/185.22, 210.11
See application file for complete search history.

(56) References Cited

U.S. PATENT DOCUMENTS

| | | | | |
|---|---|---|---|---|
| 5,864,504 | A * | 1/1999 | Tanzawa et al. | 365/185.24 |
| 6,205,074 | B1 * | 3/2001 | Van Buskirk et al. | 365/211 |
| 7,889,575 | B2 * | 2/2011 | Wang et al. | 365/189.09 |
| 7,990,793 | B2 * | 8/2011 | Kajigaya | 365/211 |
| 2005/0213387 | A1 * | 9/2005 | Kubo et al. | 365/185.21 |
| 2006/0291322 | A1 * | 12/2006 | Crippa et al. | 365/230.06 |
| 2007/0291567 | A1 * | 12/2007 | Mokhlesi et al. | 365/212 |
| 2009/0231926 | A1 * | 9/2009 | Sarin et al. | 365/185.21 |
| 2009/0251948 | A1 * | 10/2009 | Kajigaya et al. | 365/149 |
| 2010/0157672 | A1 * | 6/2010 | Barkley | 365/185.03 |

FOREIGN PATENT DOCUMENTS

| | | |
|---|---|---|
| JP | 10-275492 | 10/1998 |
| JP | 11-297084 | 10/1999 |
| JP | 2006-065945 | 3/2006 |

* cited by examiner

*Primary Examiner* — Hoai V Ho
*Assistant Examiner* — Jay Radke
(74) *Attorney, Agent, or Firm* — Myers, Bigel, Sibley & Sajovec, P.A.

(57) ABSTRACT

A nonvolatile memory device is operated by programming sample data in the memory device for verification using verify voltage levels derived from an ideal verify voltage Vv associated with a particular temperature range, performing read verify operations on the sample data using the verify voltage Vv associated with the temperature range; and determining a temperature compensation parameter Nc based on results of the read verify operations.

25 Claims, 23 Drawing Sheets

Vv : Verify Level
Vd : Cell Vth shift/20°C

| 1 | 2 | 3 | 4 | 5 | 6 | Temp. | Parameter(Nc) |
|---|---|---|---|---|---|-------|---------------|
| Pass | Fail | Fail | Fail | Fail | Fail | 90 ~ 70 | 0 |
| Pass | Pass | Fail | Fail | Fail | Fail | 70 ~ 50 | 1 |
| Pass | Pass | Pass | Fail | Fail | Fail | 50 ~ 30 | 2 |
| Pass | Pass | Pass | Pass | Fail | Fail | 30 ~ 10 | 3 |
| Pass | Pass | Pass | Pass | Pass | Fail | 10 ~ -10 | 4 |
| Pass | Pass | Pass | Pass | Pass | Pass | -10 ~ 30 | 5 |

Fig. 6

$$Vtemp = Vorg + Nc \times Vd$$

Fig. 22

| PGM Group1 | PGM Group2 | PGM Group3 | PGM Group4 | PGM Group5 | PGM Group6 | PGM Group7 | PGM Group8 | Vth Shift | Parameter(Nc) |
|---|---|---|---|---|---|---|---|---|---|
| Pass* | Pass | Pass | Pass | Pass | Pass | Pass | Pass | ~ 4Vd-Vdh | 4 |
| Fail* | Pass | Pass | Pass | Pass | Pass | Pass | Pass | 3Vd+Vdh ~ 3Vd-Vdh | 3 |
| Fail | Fail | Pass | Pass | Pass | Pass | Pass | Pass | 2Vd+Vdh ~ 2Vd-Vdh | 2 |
| Fail | Fail | Fail | Pass | Pass | Pass | Pass | Pass | Vd+Vdh ~ Vd-Vdh | 1 |
| Fail | Fail | Fail | Fail | Pass | Pass | Pass | Pass | Vdh ~ Vdh | 0 |
| Fail | Fail | Fail | Fail | Fail | Pass | Pass | Pass | -Vd+Vdh ~ -Vd-Vdh | -1 |
| Fail | Fail | Fail | Fail | Fail | Fail | Pass | Pass | -2Vd+Vdh ~ -2Vd-Vdh | -2 |
| Fail | Fail | Fail | Fail | Fail | Fail | Fail | Pass | -3Vd+Vdh ~ -3Vd-Vdh | -3 |
| Fail | Fail | Fail | Fail | Fail | Fail | Fail | Fail | -4Vd+Vdh ~ | -4 |

Fig. 24

| Results of read with Vr value | Vth Shift | Parameter(Nc) |
|---|---|---|
| Fail bit number of group1 is most close to K | 3Vd+Vdh ~ 3Vd-Vdh | 3 |
| Fail bit number of group2 is most close to K | 2Vd+Vdh ~ 2Vd-Vdh | 2 |
| Fail bit number of group3 is most close to K | Vd+Vdh ~ Vd-Vdh | 1 |
| Fail bit number of group4 is most close to K | Vdh ~ -Vdh | 0 |
| Fail bit number of group5 is most close to K | -Vd+Vdh ~ -Vd-Vdh | -1 |
| Fail bit number of group6 is most close to K | -2Vd+Vdh ~ -2Vd-Vdh | -2 |
| Fail bit number of group7 is most close to K | -3Vd+Vdh ~ -3Vd-Vdh | -3 |

METHODS OF DETECTING A SHIFT IN THE THRESHOLD VOLTAGE FOR A NONVOLATILE MEMORY CELL

CROSS REFERENCE TO RELATED APPLICATION

This application claims the benefit of and priority to Korean Patent Application No. 2008-66541, filed Jul. 9, 2008, in the Korean Intellectual Property Office, the disclosure of which is hereby incorporated herein by reference as if set forth in its entirety.

BACKGROUND OF THE INVENTION

The present invention relates generally to data processing systems and, more particularly, to the use of storage devices, such as nonvolatile memory systems in data processing systems.

Recently, the number of devices using nonvolatile memories has increased. For example, an MP3 player, a digital camera, a mobile phone, a camcorder, a flash card, and a solid state disk (SSD) are examples of devices that use nonvolatile memories as storage devices.

As more devices use nonvolatile memories as storage devices, the capacity of the nonvolatile memory is generally increasing. One method for increasing memory capacity is use of a so-called multi level cell (MLC) method in which a plurality of bits is stored in one memory cell.

A two-bit MLC may be programmed to have any one of four states 11, 01, 10 and 00 according to distribution of a threshold voltage. This is illustrated, for example, in FIG. 1 where a two-bit MLC is programmed to have one of four states 11 (E1), 01 (P1), 10 (P2), and 00 (P3). A nonvolatile memory, such as a flash memory may be programmed in units of a page. A memory controller may transfer data to a flash memory through a buffer memory in page units. A page buffer in the flash memory temporarily stores the data loaded from the buffer memory and programs the loaded data into a selected page. After completing the programming operation, a program-verifying operation is carried out to determine whether the data have been correctly programmed.

As shown in FIG. 2, however, bit errors can occur during read operations due to shifts in the threshold voltage Vth for the programmed data due to such factors as charge loss, temperature, program disturbances, and the like. FIG. 3 illustrates the affects of temperature on the distribution of cells for a particular programmed state. Typically, the threshold voltage Vth may shift approximately 50 mV for each 20° C. change in temperature.

SUMMARY

According to some embodiments of the present invention, a nonvolatile memory device is operated by programming sample data in the memory device for verification using verify voltage levels derived from an ideal verify voltage Vv associated with a particular temperature range, performing read verify operations on the sample data using the verify voltage Vv associated with the temperature range; and determining a temperature compensation parameter Nc based on results of the read verify operations.

In other embodiments, a nonvolatile memory system is operated by sending a sample page read command from a host to a memory device, programming sample data in the memory device for verification using verify voltage levels derived from an ideal verify voltage Vv associated with a particular temperature range, performing read verify operations on the sample data using the verify voltage Vv associated with the temperature range in the memory device; providing results of the read verify operations to the host, and determining a temperature compensation parameter Nc based on the results of the read verify operations at the host.

In still other embodiments, a memory system is operated by sending a command for temperature compensation from a host to a nonvolatile memory device and retrieving temperature compensated voltage values for performing program, read, and/or verify operations in the memory device.

Other systems and methods according to embodiments of the invention will be or become apparent to one with skill in the art upon review of the following drawings and detailed description. It is intended that all such additional systems and methods be included within this description, be within the scope of the present invention, and be protected by the accompanying claims.

BRIEF DESCRIPTION OF THE DRAWINGS

Other features of the present invention will be more readily understood from the following detailed description of specific embodiments thereof when read in conjunction with the accompanying drawings, in which:

FIG. 6 sets forth the temperature compensated voltage value that can be generated using the temperature compensation parameter of FIG. 5;

FIGS. 21 and 22 illustrate operations for detecting a shift in the threshold voltage for a nonvolatile memory cell in accordance with further embodiments of the present invention;

FIGS. 23 and 24 illustrate methods of detecting a shift in the threshold voltage for a nonvolatile memory cell in accordance with further embodiments of the present invention;

DETAILED DESCRIPTION OF EMBODIMENTS

Figure 1:
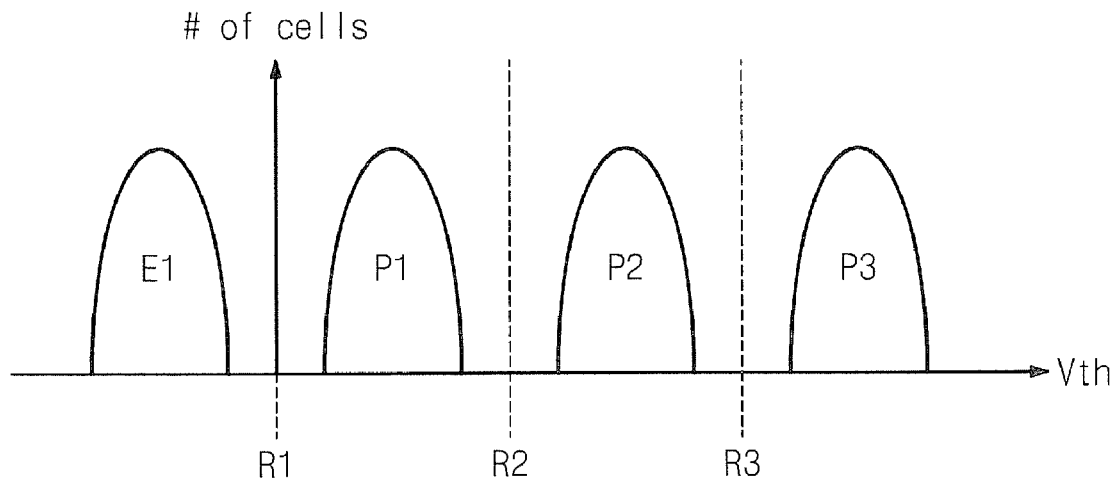
FIG. 1 is a diagram that illustrates the programming states for a two-bit multi-level memory cell.
Figure 2:
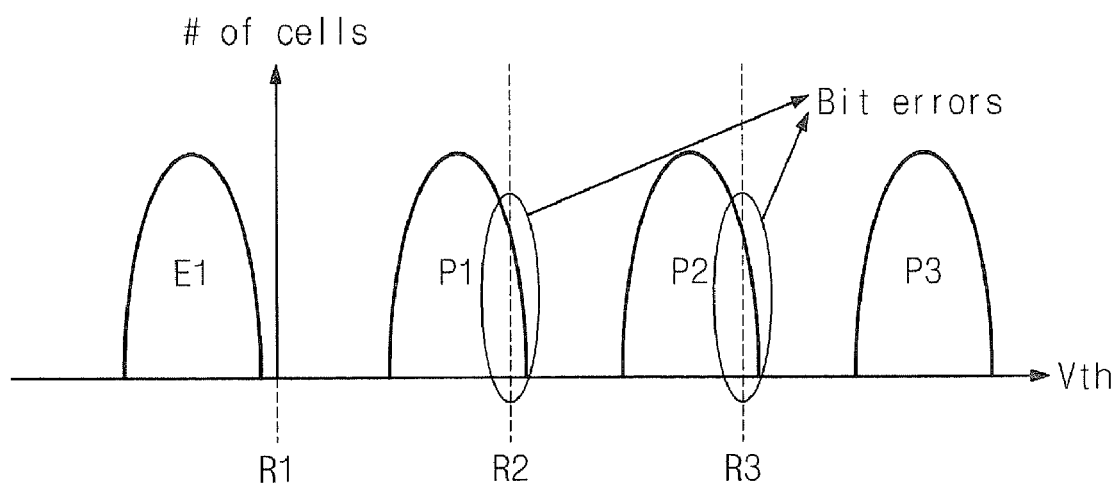
FIG. 2 is a diagram that illustrates bit errors that can occur in the multi-level memory cell of FIG. 1 due to shifts in the threshold voltage.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

For purposes of illustration, various embodiments of the present invention are described herein with reference to a nonvolatile memory system comprising a flash memory data storage device, such as a NAND, NOR, or One_NAND type flash memory storage device. It will be understood that the data storage device is not limited to implementation as a flash memory device, but can be implemented generally as an erase before write memory device. Thus, the data storage device may be a memory card device, Solid State Drive (SSD) device, ATA bus device, Serial ATA (SATA) bus device, Multi-Media Card (MMC) device, Secure Digital (SD) device, memory stick device, Hard Disk Drive (HDD) device, Hybrid Hard Drive (HHD) device, and/or a Universal Serial Bus (USB) flash drive device.

According to some embodiments of the present invention, a nonvolatile memory system can be operated by programming sample data in a memory device, performing read verify operations on the sample data, and determining a temperature compensation parameter based on the results of the read verify operations. The determination of the temperature compensation parameter may be performed in the memory device and/or in a host system or controller that communicates with the memory device. Once the temperature compensation parameter has been determined, compensated voltage level values may, for example, be stored in the memory device for use in programming data, reading data, and/or verifying data.

Figures 4, 5:
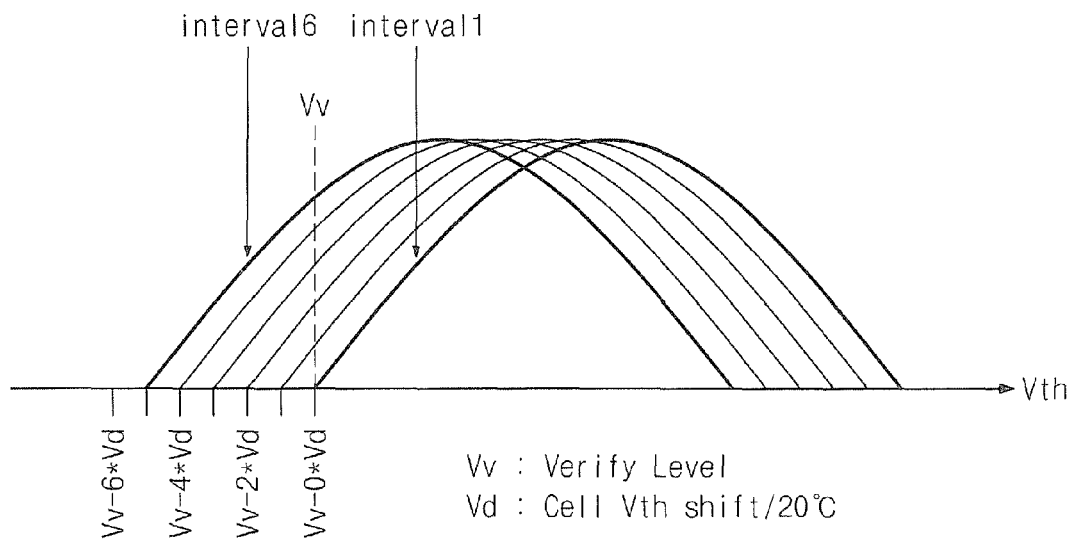
FIG. 4 illustrates operations for detecting a shift in the threshold voltage for a nonvolatile memory cell in accordance with some embodiments of the present invention.
FIG. 5 shows a temperature compensation conversion table that is generated based on performing read verify operations on the sample data of FIG. 4.

FIG. 4 illustrates operations for detecting a shift in the threshold voltage for a nonvolatile memory cell in accordance with some embodiments of the present invention. As shown in FIG. 4, sample data can be programmed in a nonvolatile memory device, such as a flash memory device, for verification using verify voltage levels derived from an ideal verify voltage Vv. In the example shown, data are programmed for verification levels Vv through Vv−6Vd, where Vd is typical shift in the threshold voltage Vth per unit of temperature, which in this example is 20° C. Further, in the example of FIG. 4 the verification voltage Vv is associated with the 90-70° C. range.

Figure 3:
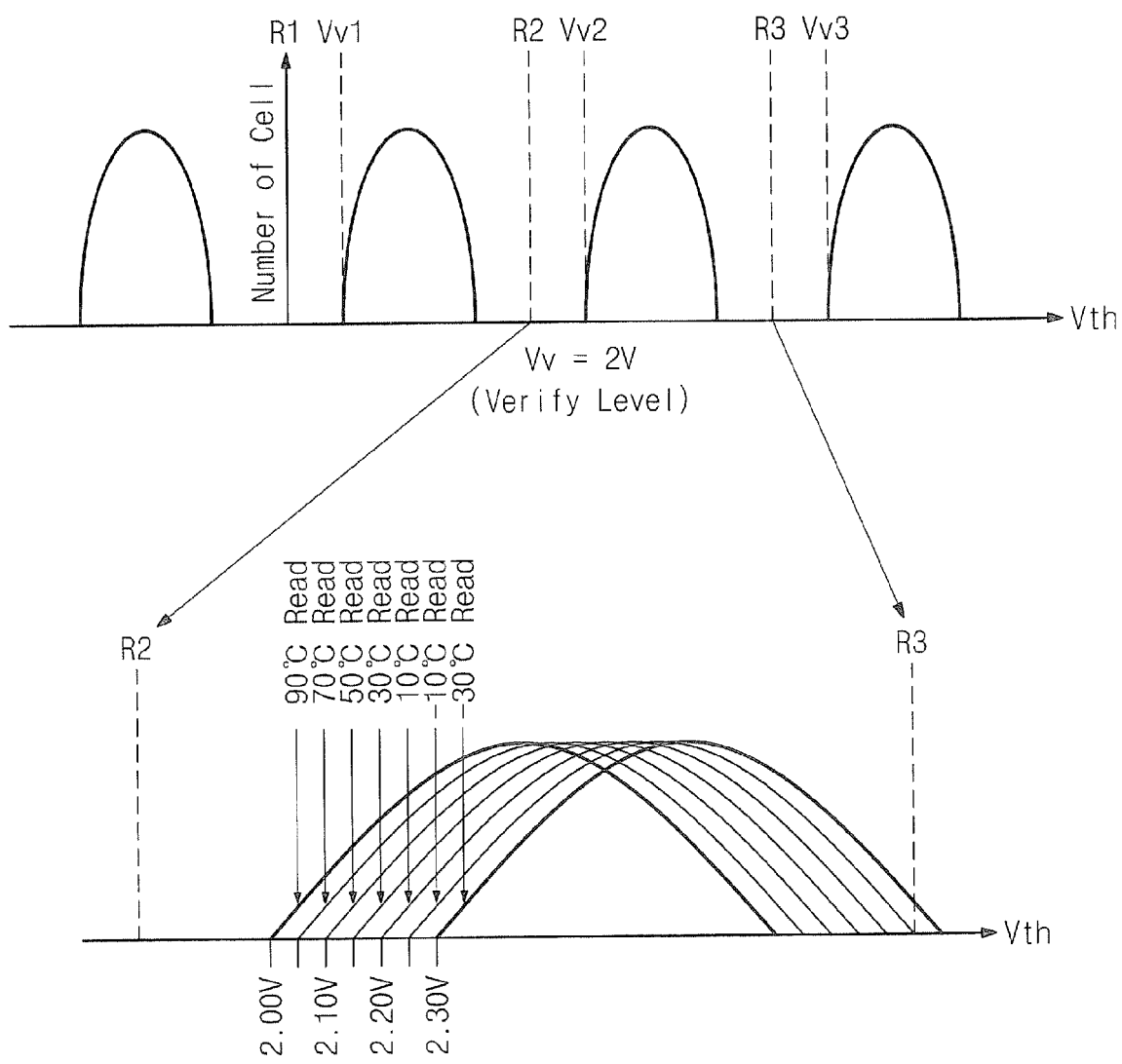
FIG. 3 is a graph that illustrates the affects of temperature on the distribution of cells for a particular programmed state.

FIG. 5 shows a temperature compensation conversion table that is generated based on performing read verify operations on the sample data of FIG. 4. Because the verify voltage Vv is based on the 90-70° C. range, if the actual temperature falls in that range, then only the first interval of sample data (programmed based on a verification level Vv) should pass while the other intervals of sample data (programmed based on verification levels of Vv−*Vd) should fail. If, however, the actual temperature is less than the 90-70° C. range, then the program distributions of FIG. 4 shift to the right as illustrated in FIG. 3 resulting one of the other temperature ranges having only one interval of sample data that passes while all others fail. In this way, a temperature compensation parameter Nc can be computed as shown in FIG. 5.

Figure 6:
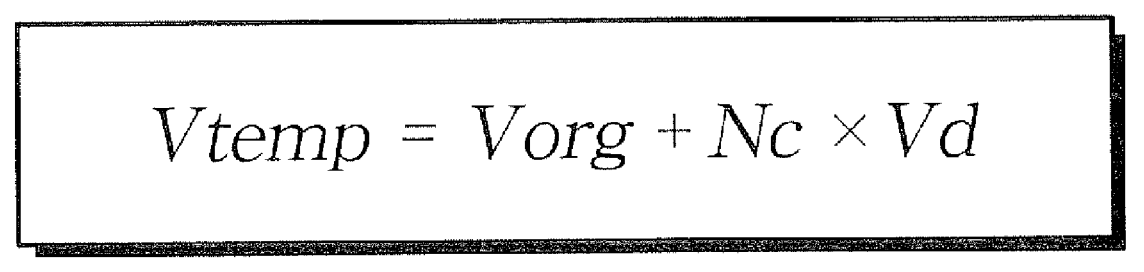

FIG. 6 sets forth the temperature compensated voltage value that can be generated using the temperature compensation parameter of FIG. 5. A temperature compensated voltage value can be generated as Vtemp=Vorg+Nc*Vd, where Vorg is the original, uncompensated voltage value. The temperature compensated voltages can be used in programming, reading, and verifying operations in accordance with various embodiments of the present invention.

Figure 7:
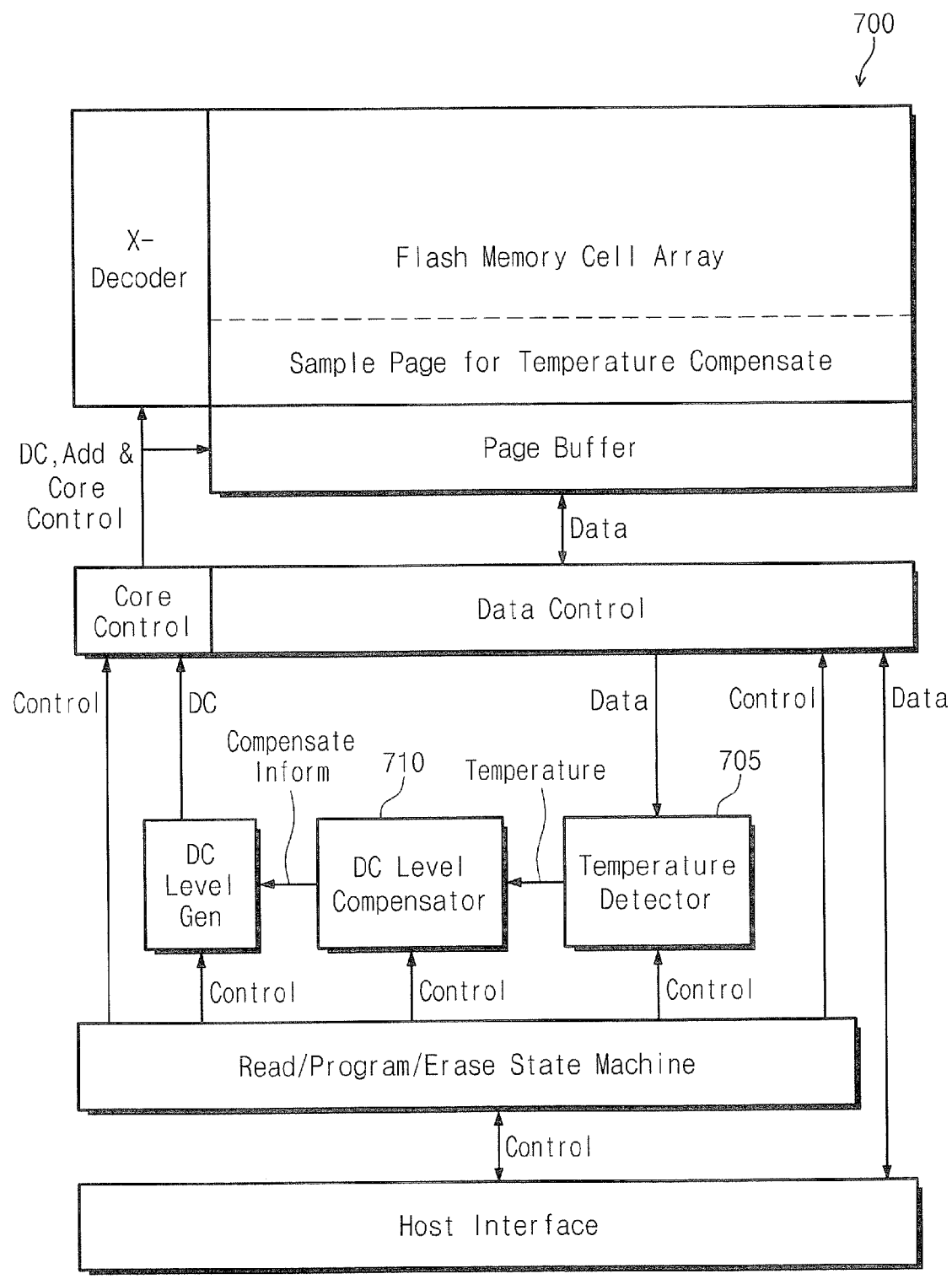
FIG. 7 illustrates a flash memory having an on-chip temperature compensation function in accordance with some embodiments of the present invention.

FIG. 7 illustrates a flash memory 700 having an on-chip temperature compensation function in accordance with some embodiments of the present invention. As shown in FIG. 7, a temperature detector 705 can be configured to determine a temperature compensation parameter Nc based on verify operations performed on a page of sample data programmed as discussed above with respect to FIGS. 4 and 5. Based on the temperature compensation parameter Nc, a DC level compensator module 710 may generate temperature compensated DC voltage levels for use in program, read, and/or verify operations.

Figure 8:
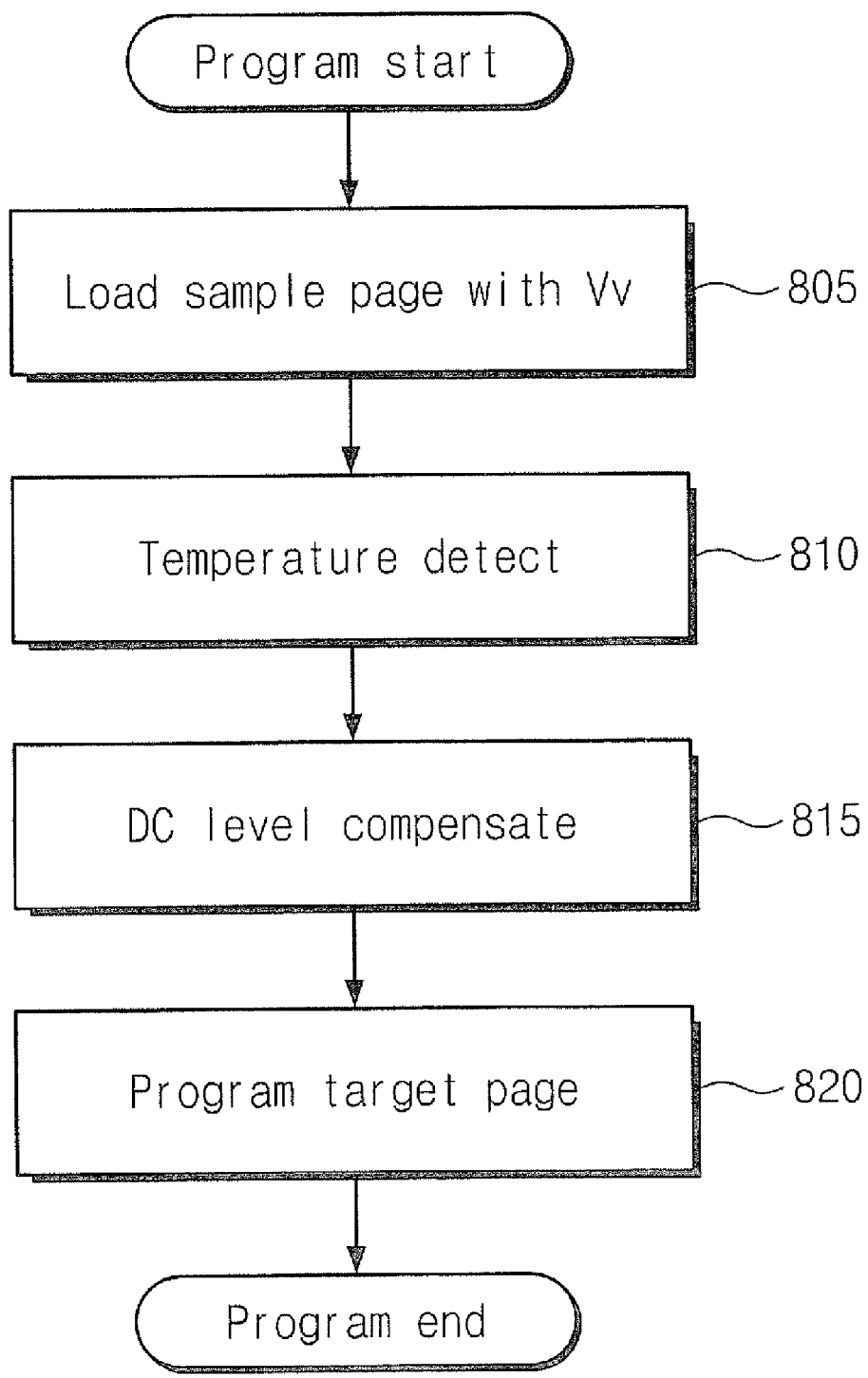
FIG. 8 is a flowchart that illustrates program operations while providing threshold voltage temperature compensation in a nonvolatile memory device, such as a flash memory, in accordance with some embodiments of the present invention.

FIG. 8 is a flowchart that illustrates program operations while providing threshold voltage temperature compensation in a nonvolatile memory device, such as a flash memory, in accordance with some embodiments of the present invention. Operations begin at block 805 where sample data is programmed into the memory device. At block 810, a temperature compensation parameter Nc is determined as discussed above with respect to FIGS. 4 and 5. At block 815, the temperature compensation parameter Nc is used to generate temperature compensated DC voltage levels for use in program, read, and/or verify operations. A target page may be programmed using the temperature compensated DC voltage levels at block 820.

Figure 9:
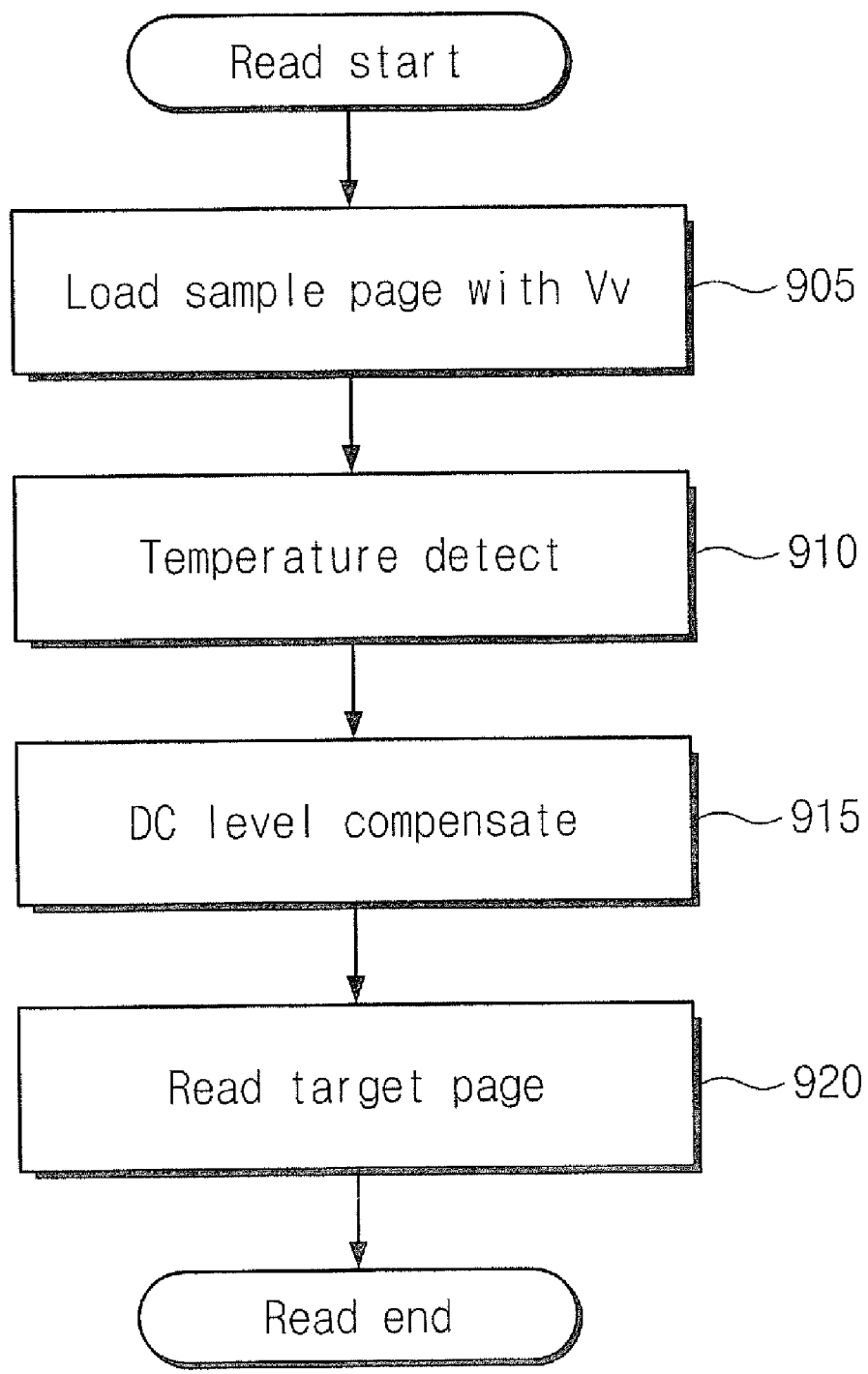
FIG. 9 is a flowchart that illustrates read operations while providing threshold voltage temperature compensation in a nonvolatile memory device, such as a flash memory, in accordance with some embodiments of the present invention.

FIG. 9 is a flowchart that illustrates read operations while providing threshold voltage temperature compensation in a nonvolatile memory device, such as a flash memory, in accordance with some embodiments of the present invention. Operations begin at block 905 where sample data is programmed into the memory device. At block 910, a temperature compensation parameter Nc is determined as discussed above with respect to FIGS. 4 and 5. At block 915, the temperature compensation parameter Nc is used to generate temperature compensated DC voltage levels for use in program, read, and/or verify operations. A target page may be read using the temperature compensated DC voltage levels at block 920.

Figure 10:
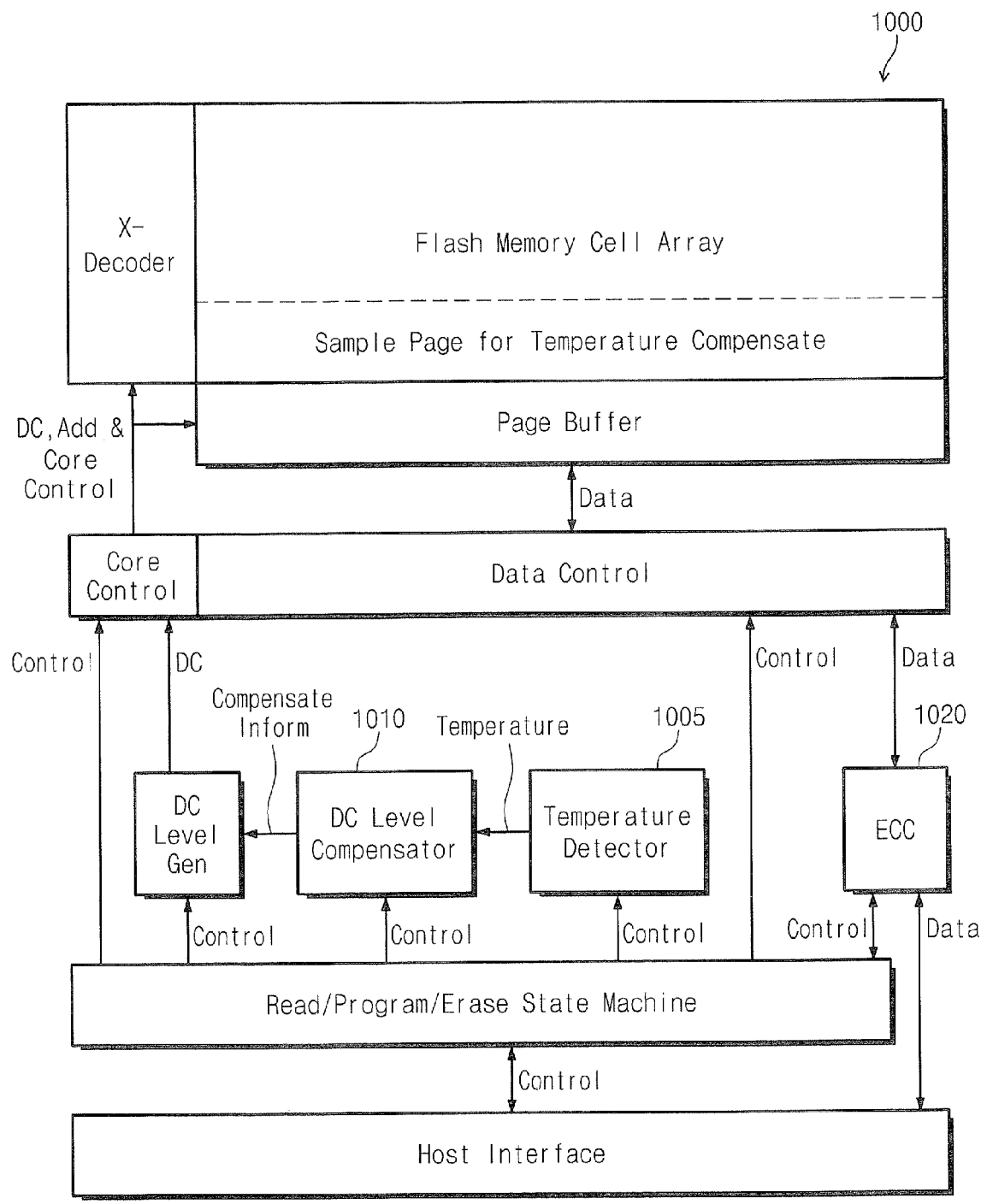
FIG. 10 illustrates a flash memory having an on-chip temperature compensation function and error control function in accordance with some embodiments of the present invention.

In accordance with some embodiments of the present invention, temperature compensation may be combined with an error control function. As shown in FIG. 10, a flash memory 1000, such as the flash memory 700 of FIG. 7 may further include an error control circuit 1020 that may determined whether errors read from a target page are correctable. The temperature detector 1005 and DC level compensator module 1010 are similar to the like modules discussed above with respect to FIG. 7, but are responsive the error control circuit 1020 as described below.

Figure 11:
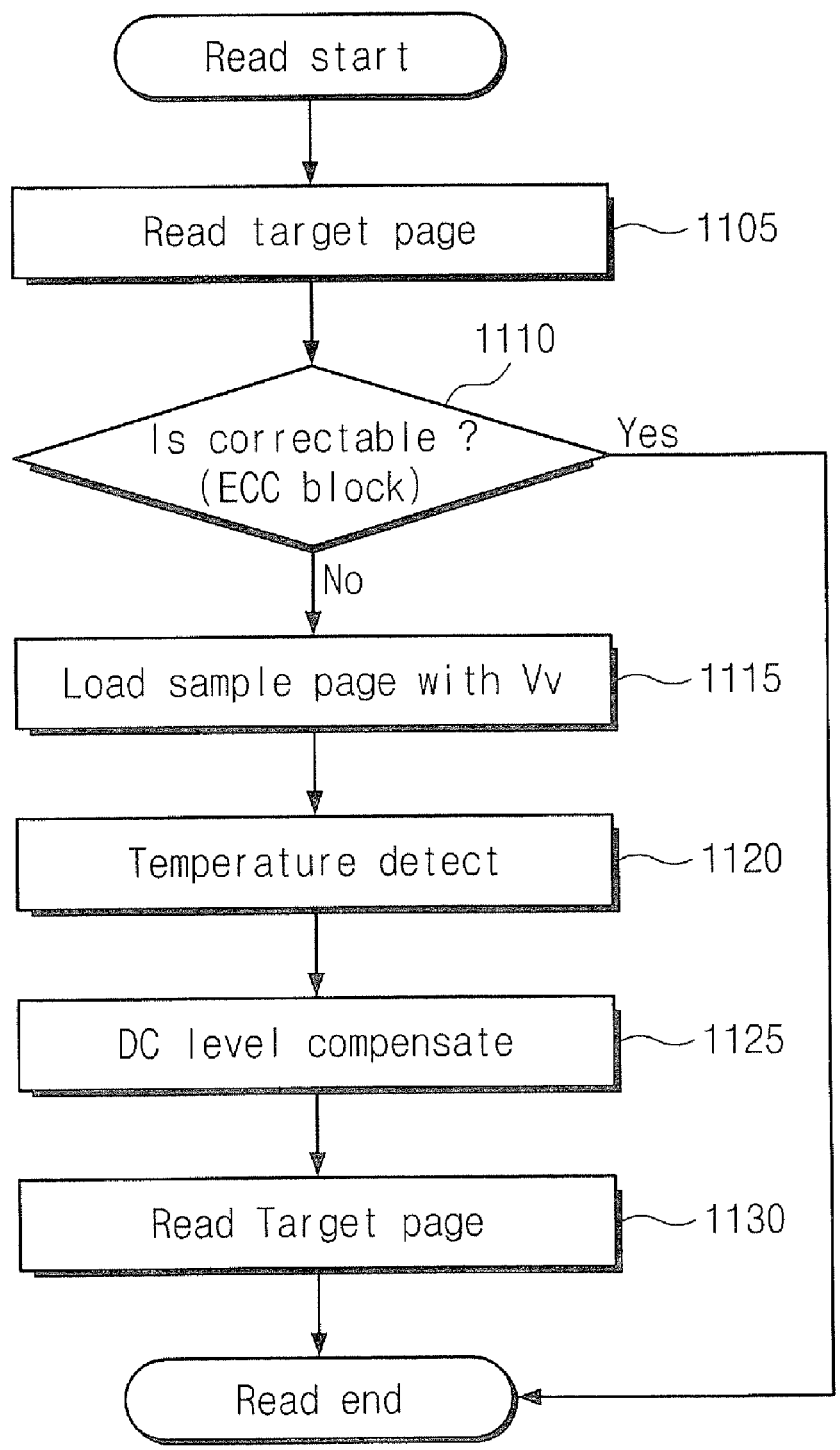
FIG. 11 is a flowchart that illustrates operations of the flash memory of FIG. 10 in accordance with some embodiments of the present invention.

FIG. 11 is a flowchart that illustrates operations of the flash memory 1000 in accordance with some embodiments of the present invention. Operations begin at block 1105 where a target page is read. The error control circuit 1020 of FIG. 10 determines if the target page errors are correctable at block 1110. If so, then the error control circuit 1020 corrects the errors and operations end. If, however, the errors are not correctable, then operations continue at block 1115 where sample data is programmed into the memory device. At block 1120, a temperature compensation parameter Nc is determined as discussed above with respect to FIGS. 4 and 5. At block 1125, the temperature compensation parameter Nc is used to generate temperature compensated DC voltage levels for use in program, read, and/or verify operations. The target page may be re-read using the temperature compensated DC voltage levels at block 1130.

Figure 12:
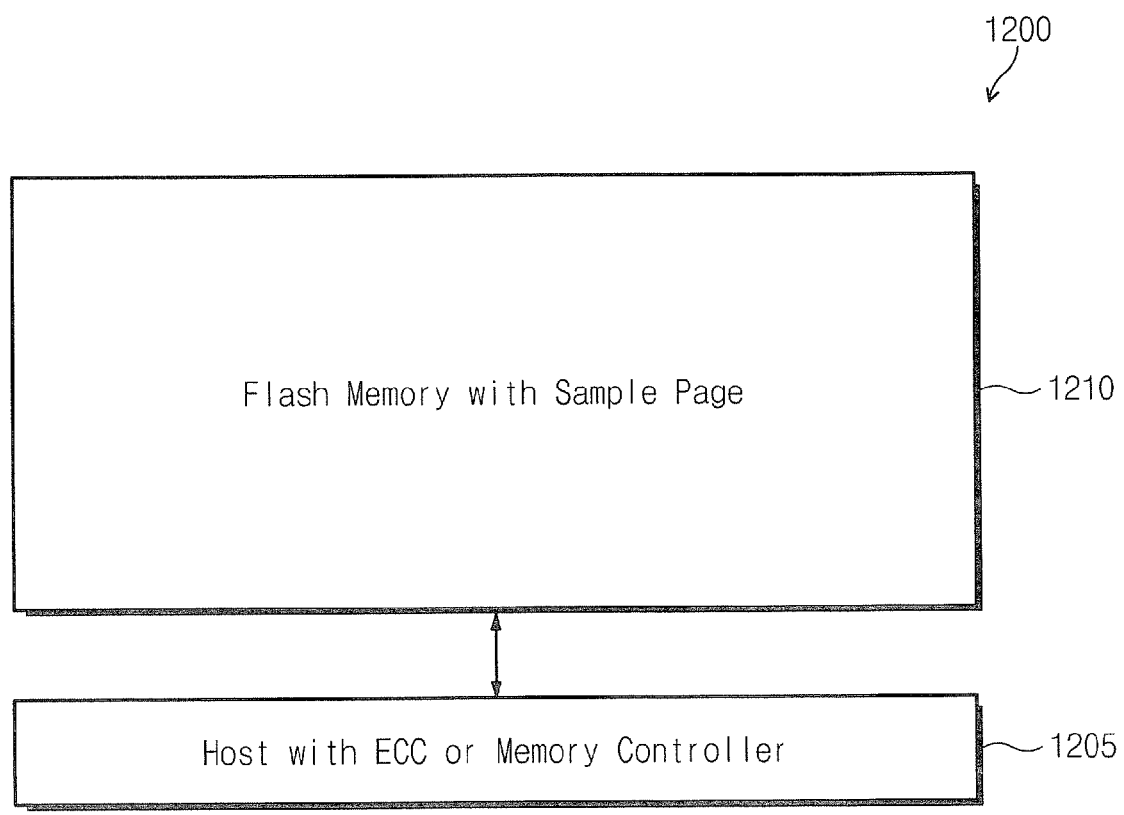
FIG. 12 is a block diagram that illustrates a memory system, according to some embodiments of the present invention, in which the host or memory controller includes the error control circuit rather than the flash memory.

FIG. 12 is a block diagram that illustrates a memory system 1200, according to some embodiments of the present invention, in which the host or memory controller 1205 includes the error control circuit rather than the flash memory 1210.

Figure 13:
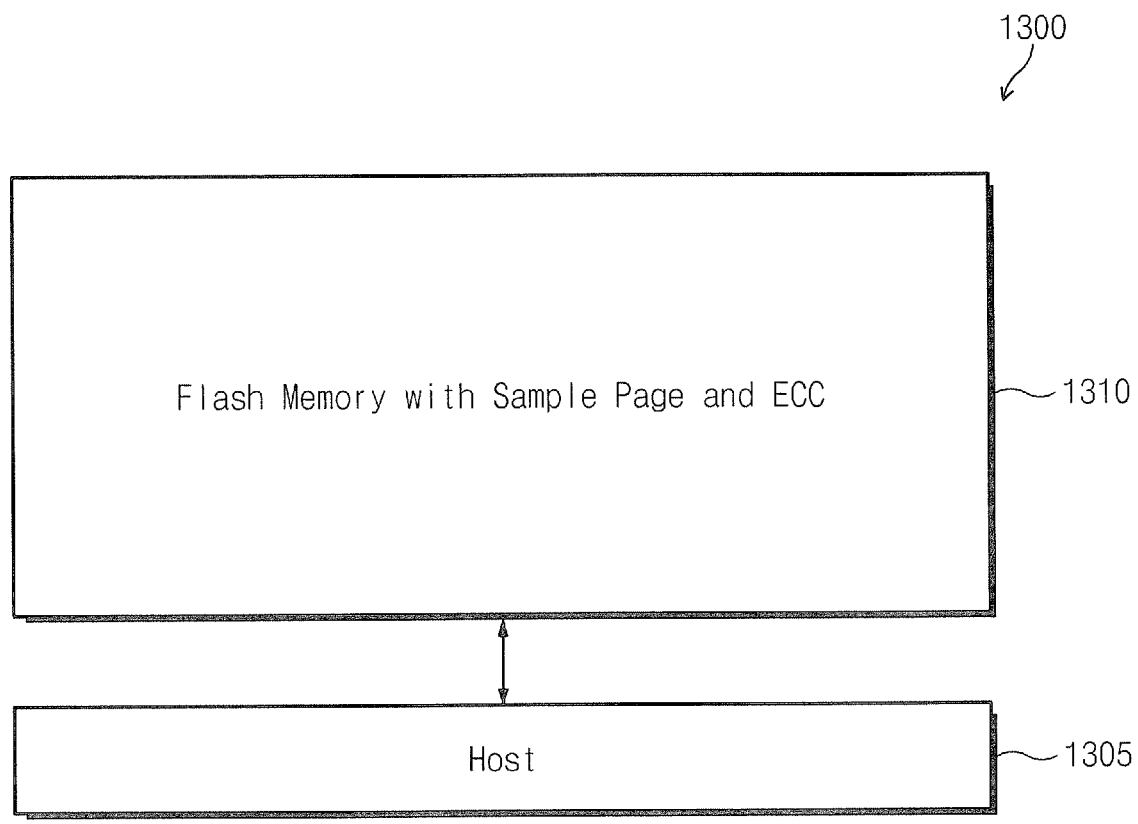
FIG. 13 is a block diagram that illustrates a memory system, according to some embodiments of the present invention, in which the flash memory includes the error control circuit rather than the host or memory controller.

FIG. 13 is a block diagram that illustrates a memory system 1300, according to some embodiments of the present invention, in which the host or memory controller 1305 does not include the error control circuit. Instead, the error control circuit is incorporated into the flash memory 1310.

Figure 14:
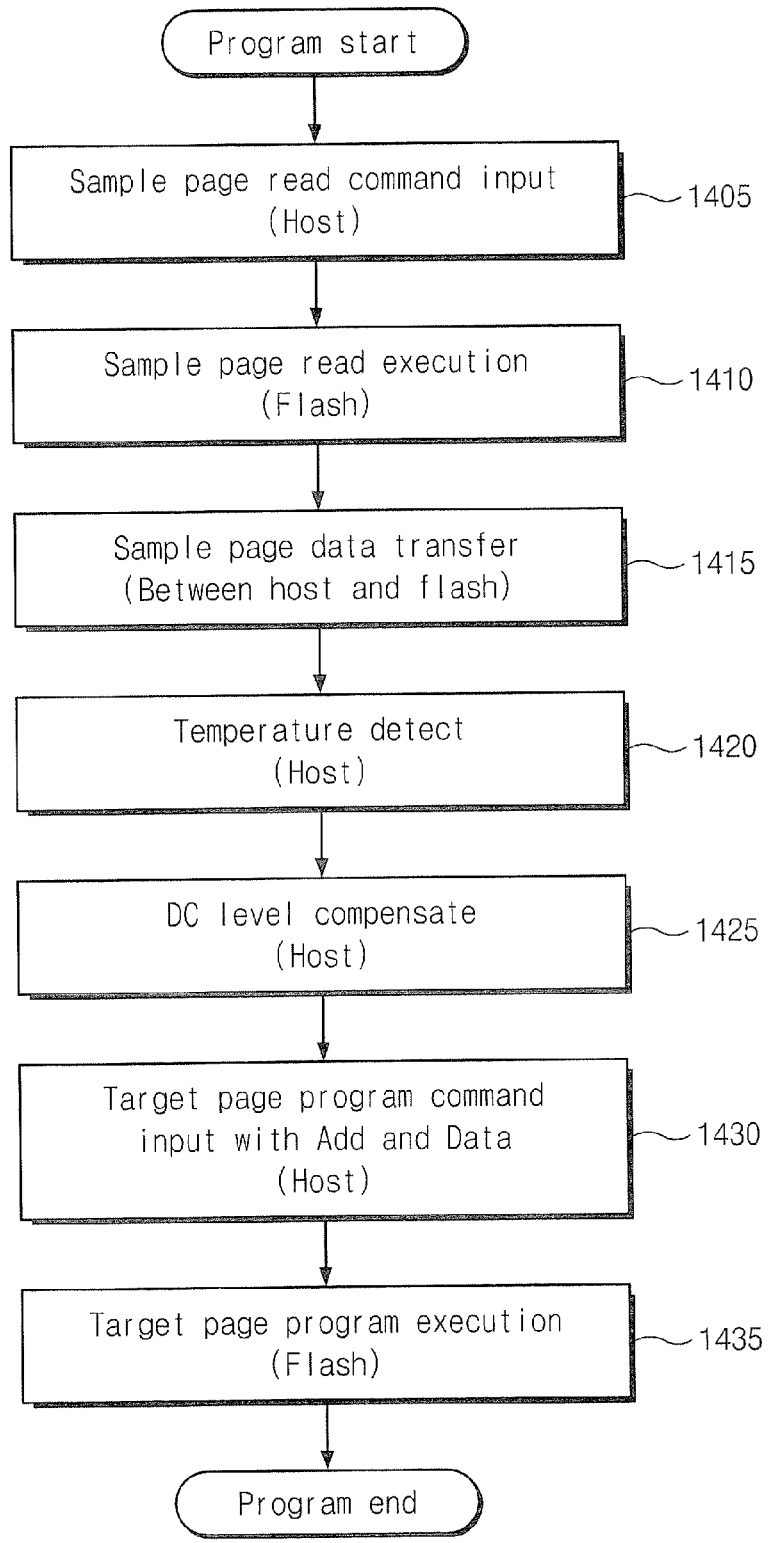
FIG. 14 illustrates program operations while performing threshold voltage temperature compensation for a memory system at the host or memory controller in accordance with some embodiments of the present invention.

According to various embodiments of the present invention, temperature detection and compensation may be performed at the host or memory controller and/or in the flash memory. FIG. 14 illustrates program operations while performing threshold voltage temperature compensation for a memory system at the host or memory controller in accordance with some embodiments of the present invention. Operations begin at block 1405 where the host sends a sample page read command to the flash memory device. At block 1410, the flash memory device executes the read command and transfers the data to the host at block 1415. At block 1420, a temperature compensation parameter Nc is determined at the host as discussed above with respect to FIGS. 4 and 5. At block 1425, the temperature compensation parameter Nc is used to generate temperature compensated DC voltage levels for use in program, read, and/or verify operations. These temperature compensated DC voltage levels are communicated to the flash memory. The host then sends a target page program command to the flash memory at block 1430, which is executed by the flash memory at block 1435.

Figure 15:
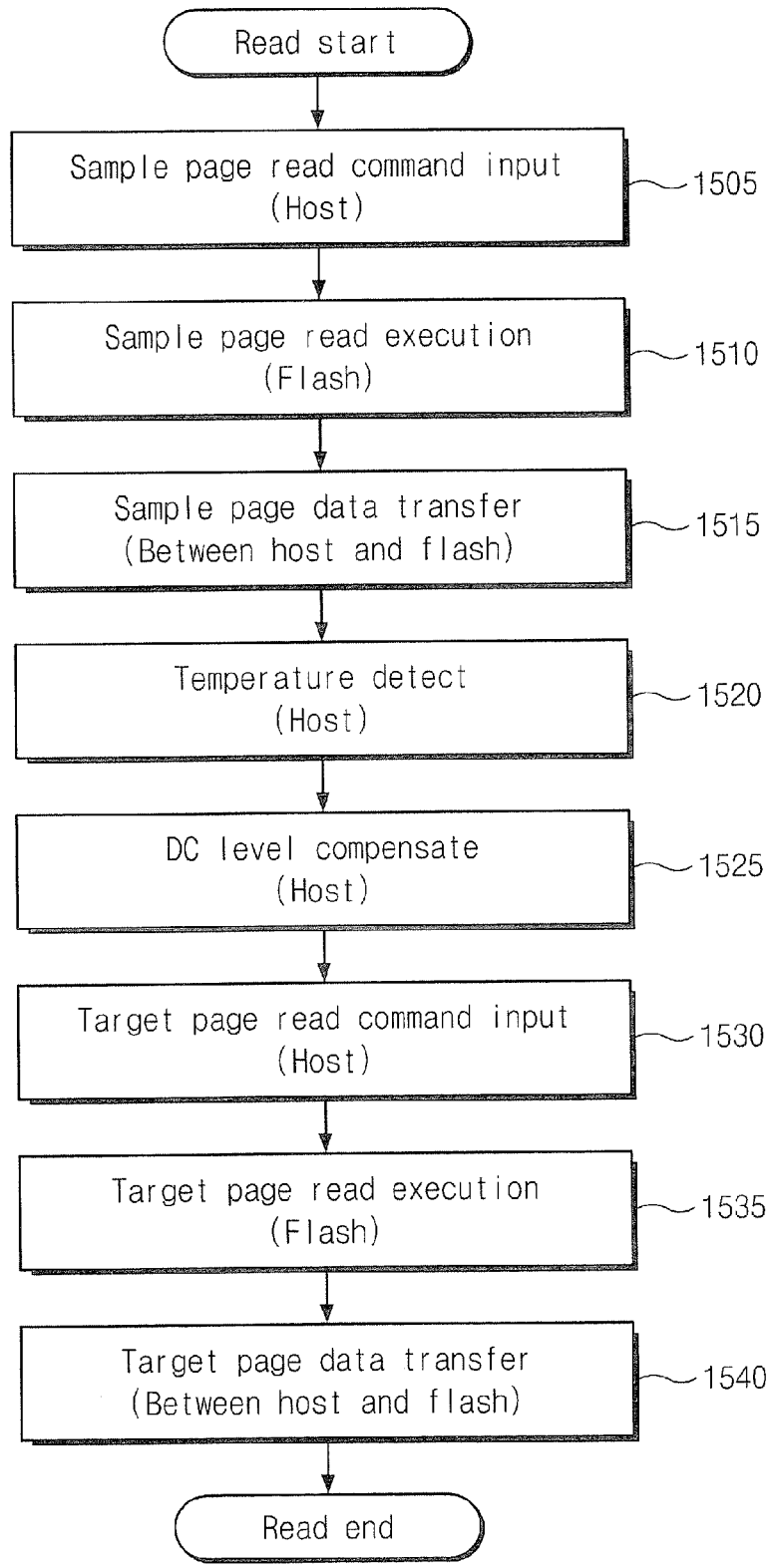
FIG. 15 illustrates read operations while performing threshold voltage temperature compensation for a memory system at the host or memory controller in accordance with some embodiments of the present invention.

FIG. 15 illustrates read operations while performing threshold voltage temperature compensation for a memory system at the host or memory controller in accordance with some embodiments of the present invention. Operations begin at block 1505 where the host sends a sample page read command to the flash memory device. At block 1510, the flash memory device executes the read command and transfers the data to the host at block 1515. At block 1520, a temperature compensation parameter Nc is determined at the host as discussed above with respect to FIGS. 4 and 5. At block 1525, the temperature compensation parameter Nc is used to generate temperature compensated DC voltage levels for use in program, read, and/or verify operations. These temperature compensated DC voltage levels are communicated to the flash memory. The host then sends a target page read command to the flash memory at block 1530, which is executed by the flash memory at block 1535. The target page data is transferred to the host at block 1540.

Figure 16:
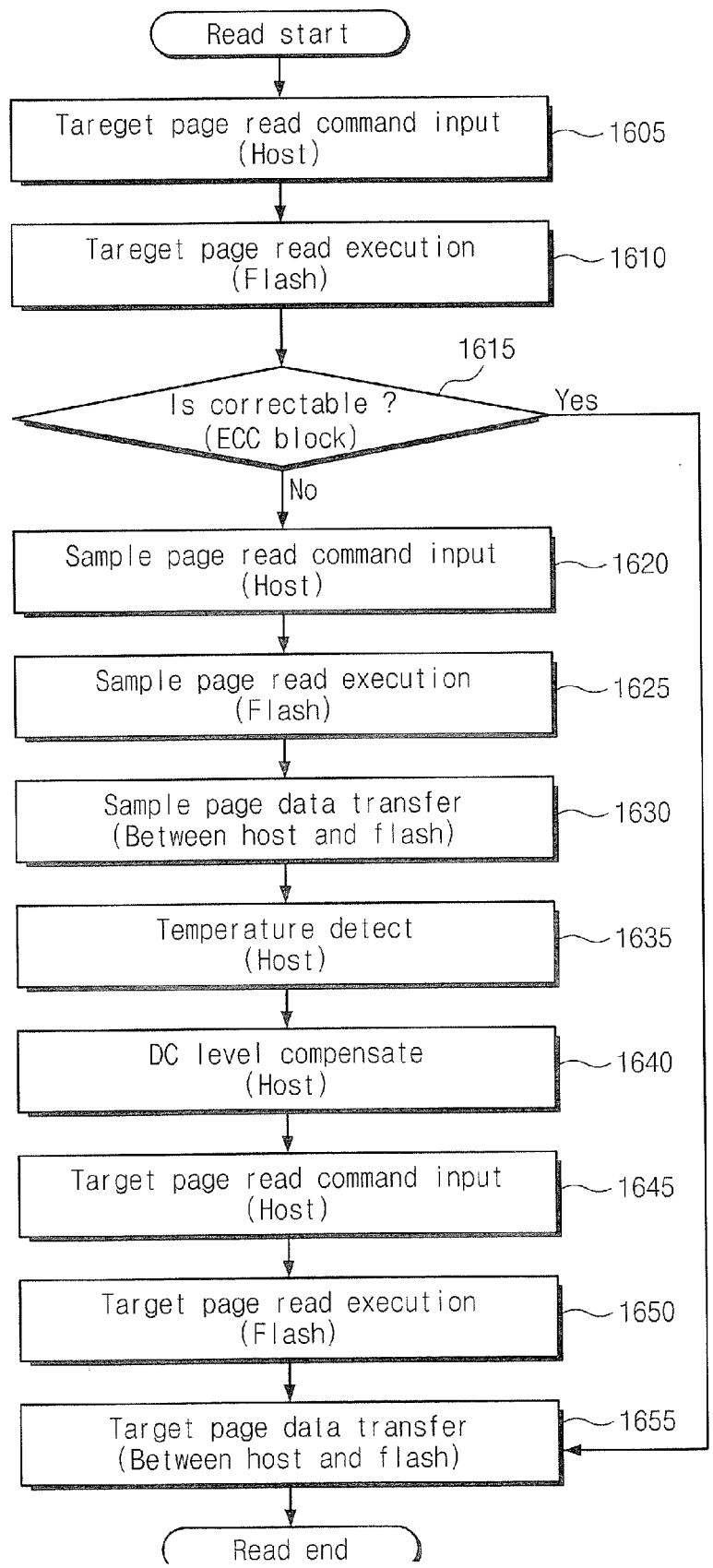
FIG. 16 illustrates read operations while performing error correction and/or threshold voltage temperature compensation at the host or memory controller in accordance with some embodiments of the present invention.

Similar to the embodiments discussed above where error correction can be performed first before temperature compensation operations are performed, FIG. 16 illustrates read operations while performing error correction and/or threshold voltage temperature compensation at the host or memory controller in accordance with some embodiments of the present invention. Operations begin at block 1605 where the host sends a target page read command to the flash memory device. At block 1610, the flash memory device executes the read command. The error control circuit 1020 of FIG. 10 determines if the target page errors are correctable at block 1615. If so, then the error control circuit 1020 corrects the errors and operations end. If, however, the errors are not correctable, then operations continue at block 1620 where the host sends a sample page read command to the flash memory device. At block 1625, the flash memory device executes the read command and transfers the data to the host at block 1630.

At block 1635, a temperature compensation parameter Nc is determined at the host as discussed above with respect to FIGS. 4 and 5. At block 1640, the temperature compensation parameter Nc is used to generate temperature compensated DC voltage levels for use in program, read, and/or verify operations. These temperature compensated DC voltage levels are communicated to the flash memory. The host then sends a target page read command to the flash memory at block 1645, which is executed by the flash memory at block 1650. The target page data is transferred to the host at block 1655.

Figure 17:
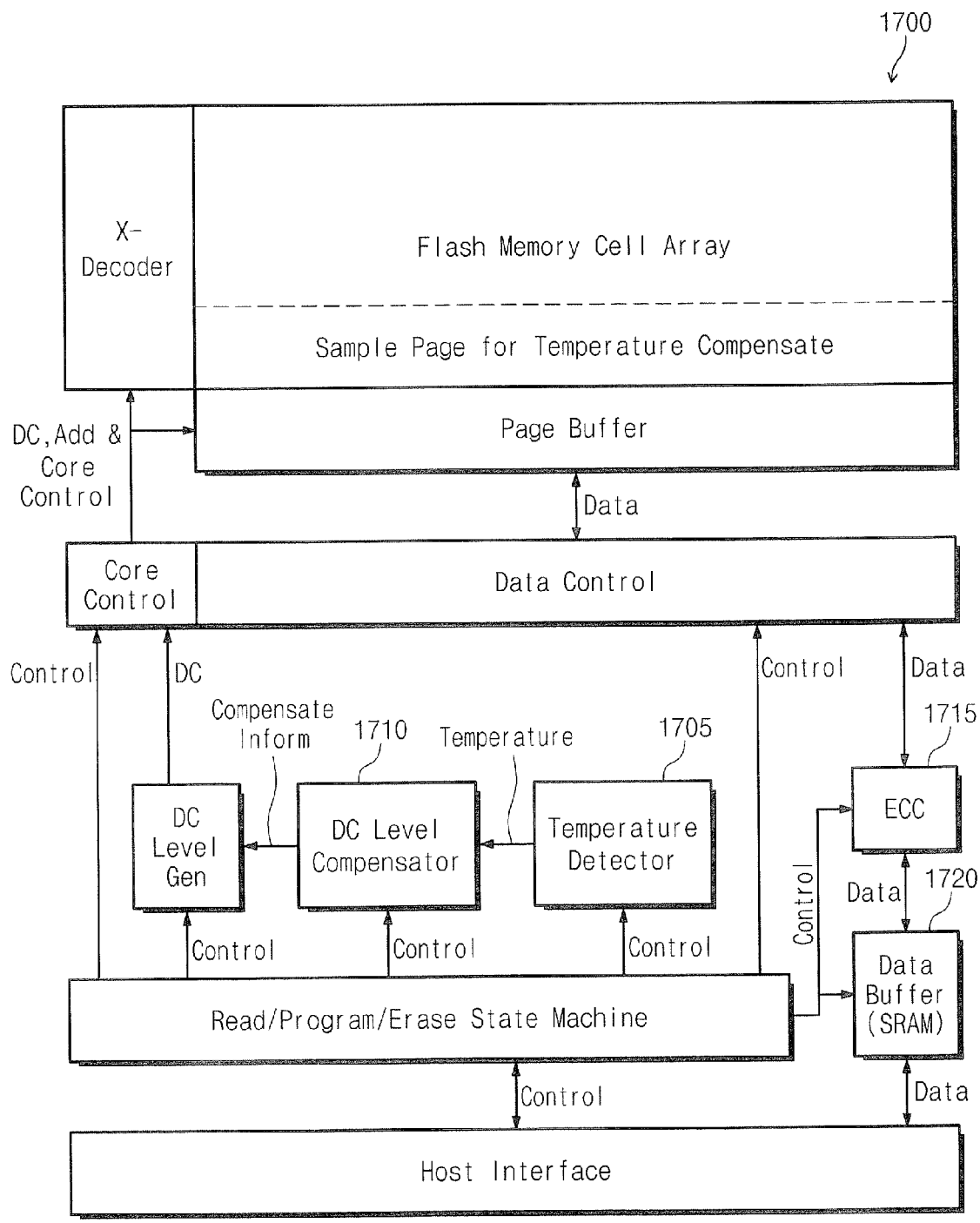
FIG. 17 illustrates a flash memory, such as the flash memory of FIG. 10, which further includes a data buffer that can be used as a buffer memory between the flash memory and the host.

FIG. 17 illustrates a flash memory 1700, such as the flash memory 1000 of FIG. 10, which further includes a data buffer 1720 that can be used as a buffer memory between the flash memory and the host. The temperature detector 1705, DC level compensator module 1710, and error correction circuit 1715 are similar to the like modules discussed above with respect to FIGS. 7 and 10.

Figure 18:
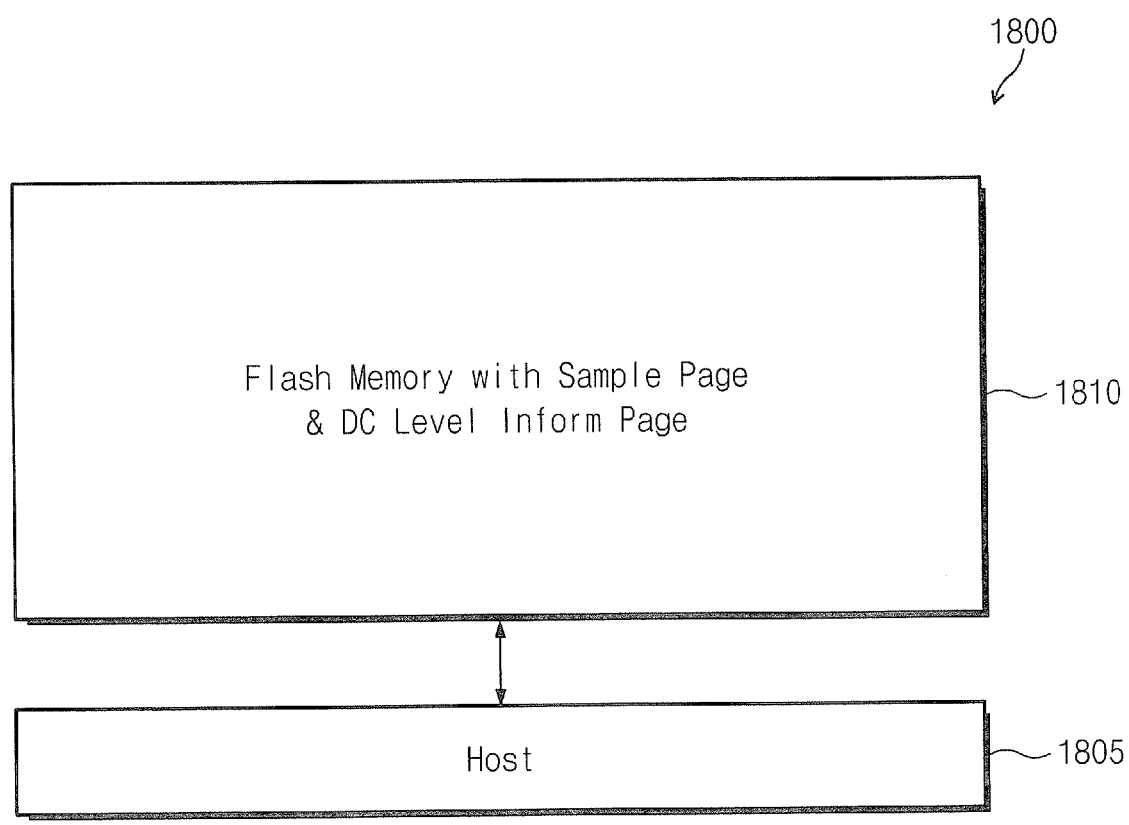
FIG. 18 illustrates a memory system including a host and a flash memory having temperature compensated voltage values stored in the memory cells of the flash memory according to some embodiments of the present invention.
Figure 19:
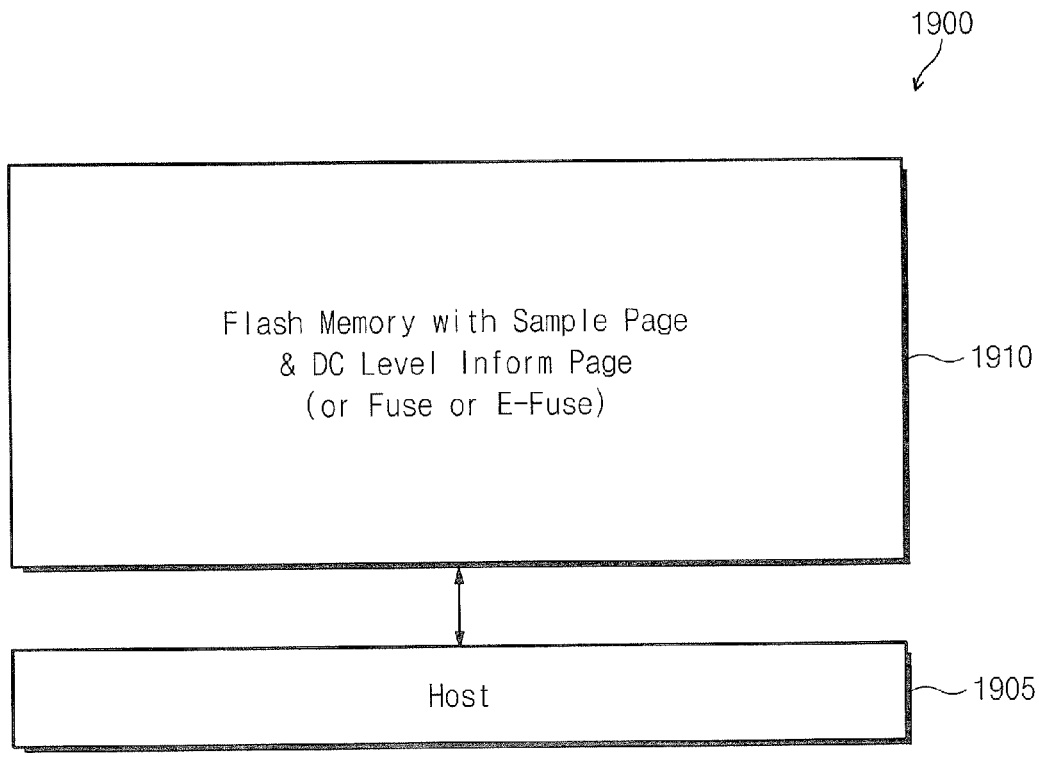
FIG. 19 illustrates a memory system including a host and a flash memory having temperature compensated voltage values stored in registers in the flash memory and/or programmed in fuses in the flash memory in accordance with some embodiments of the present invention.

In accordance with various embodiments of the present invention, temperature compensated voltage values may be stored in different locations. As shown in FIG. 18, a memory system 1800 including a host 1805 and a flash memory 1810 may have temperature compensated voltage values stored in the memory cells of the flash memory. As shown in FIG. 19, a memory system 1900 including a host 1905 and a flash memory 1910 may have temperature compensated voltage values stored in registers in the flash memory 1910 and/or programmed in fuses in the flash memory 1910.

Figure 20:
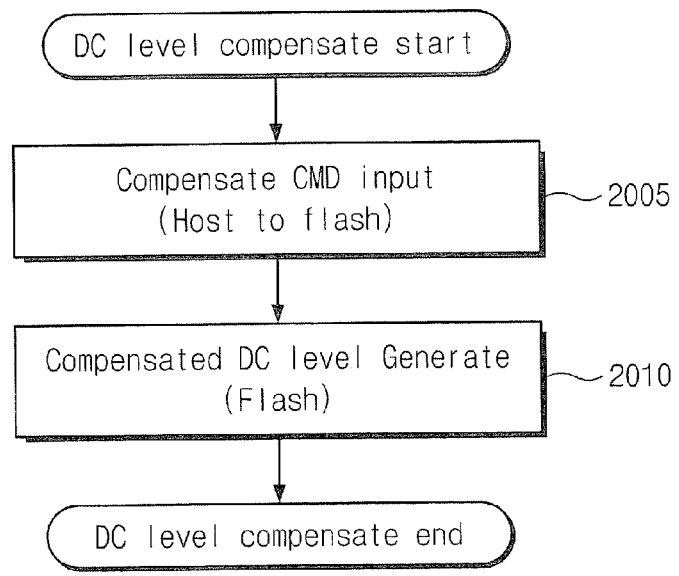
FIG. 20 is a flow chart that illustrates operations of a memory system incorporating threshold voltage temperature compensation in accordance with some embodiments of the present invention.

FIG. 20 is a flow chart that illustrates operations of a memory system incorporating threshold voltage temperature compensation in accordance with some embodiments of the present invention. Operations begin at block 2005 where a host sends a command for temperature compensation to a nonvolatile memory device, such as a flash memory. At block 2010, the flash memory retrieves temperature compensated voltage values for use in performing program, read, and/or verify operations.

Figure 21:
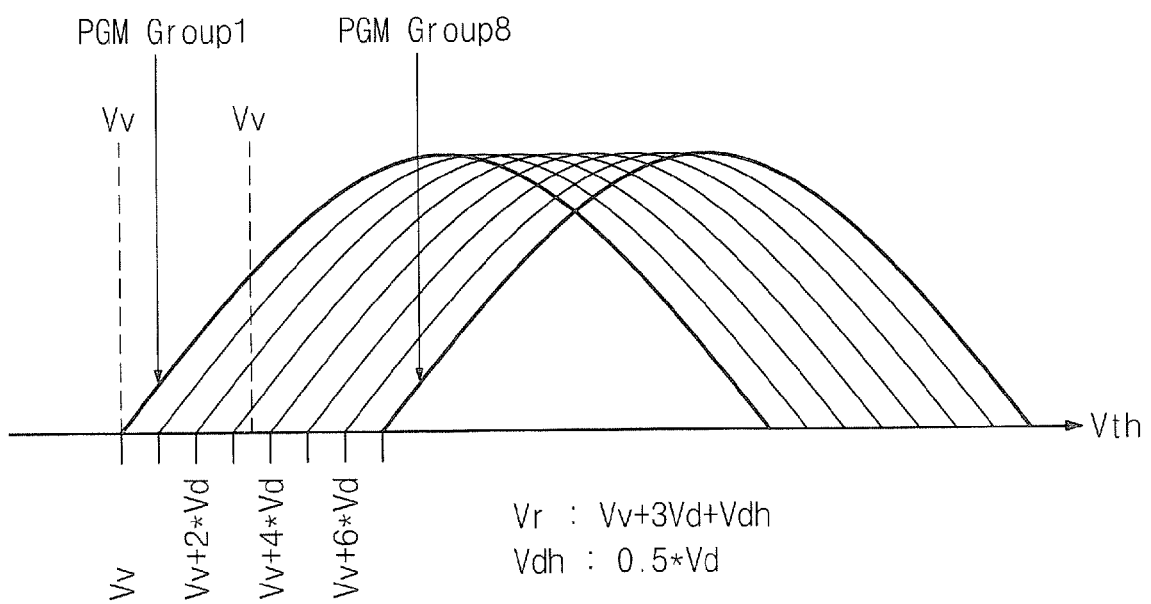

FIGS. 21 and 22 illustrate operations for detecting a shift in the threshold voltage for a nonvolatile memory cell in accordance with further embodiments of the present invention. Similar to the approach discussed above with respect to FIG. 4, N groups of sample data are programmed in a memory device for verification using voltage levels in the range of Vv through Vv+(N−1)Vd where Vd is a constant value. Read verify operations are performed on the N groups of sample data using a verify voltage of (Vv+(N−1)Vd)/2. A temperature compensation parameter Nc is determined based on pass/fail results of the read verify operations.

Figure 23:
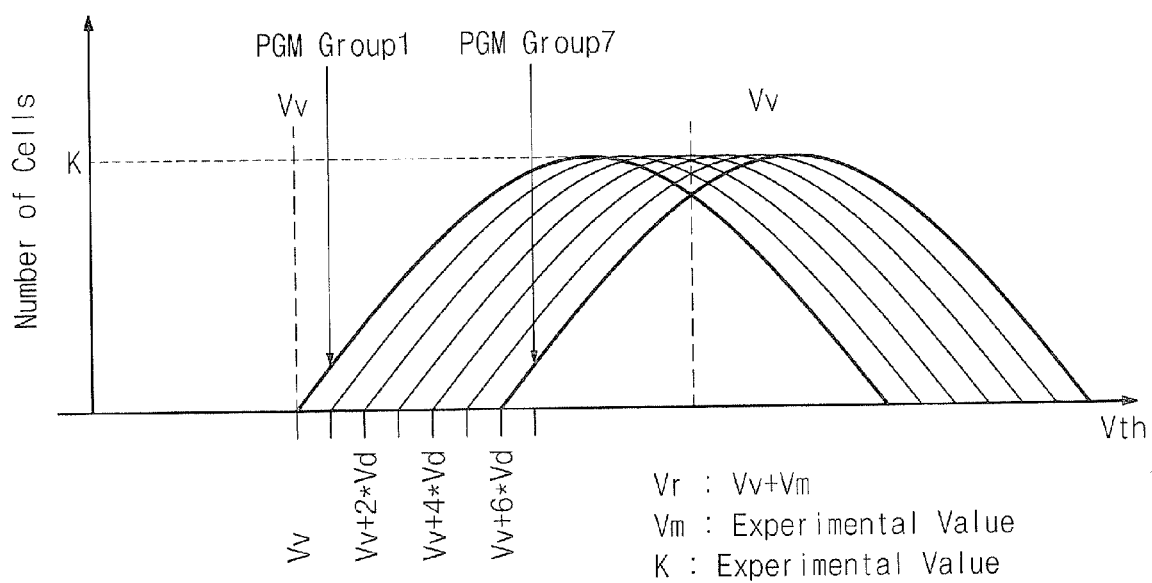

FIGS. 23 and 24 illustrate operations for detecting a shift in the threshold voltage for a nonvolatile memory cell in accordance with further embodiments of the present invention. Similar to the approaches discussed above with respect to FIGS. 4, 21 and 22, N groups of sample data are programmed in the memory device for verification using verify voltage levels in the range of Vv through Vv+(N−1)Vd where Vd is a constant value. Read verify operations are performed on the N groups of sample data using a verify voltage of Vv+Vm, where Vm is an experimentally determined constant value. A temperature compensation parameter Nc is determined based on a number of fail bits determined for each of the N groups.

Figure 25:
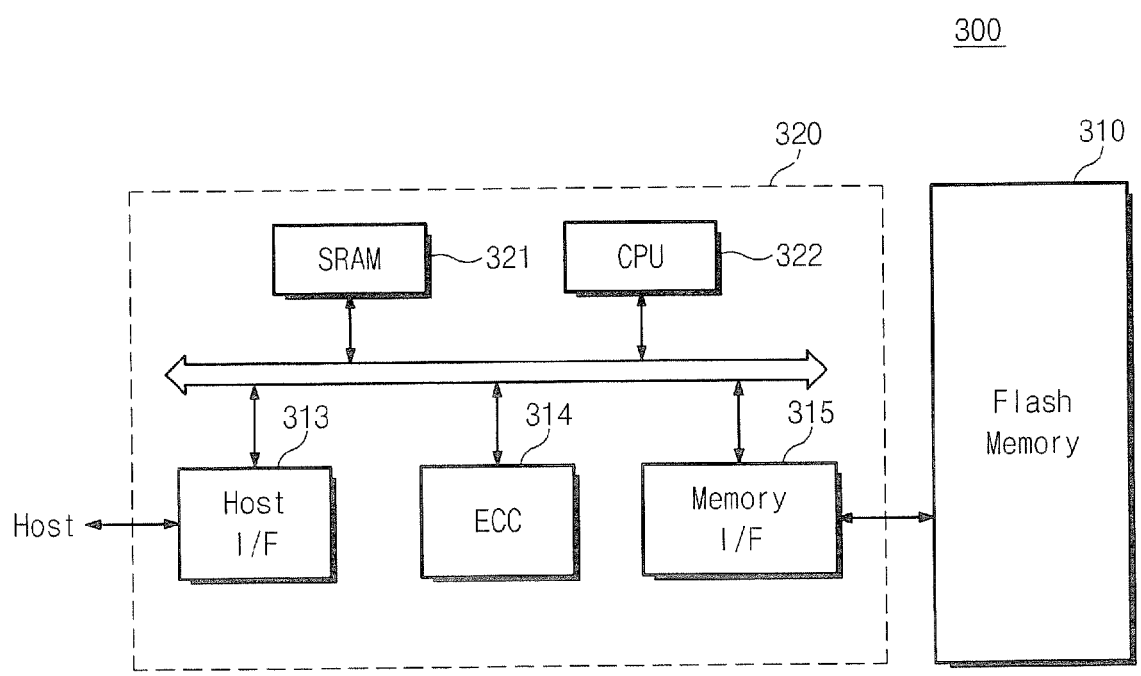
FIG. 25 is a block diagram that illustrates a memory card that includes a nonvolatile memory according to some embodiments of the present invention.

FIG. 25 is a block diagram that illustrates a memory card 300 that comprises a nonvolatile memory, such as a flash memory 310, according to some embodiments of the present invention. The memory card comprises a memory controller, which comprises an SRAM 321, a CPU 322, a host interface 323, an error correction code (ECC) module 324, and a memory interface 325 that are communicatively coupled by an address/data bus. The memory controller 320 communicates with the flash memory 310 via the memory interface 325. The flash memory 310 may be embodied as discussed above with respect to FIGS. 4-24.

Figure 26:
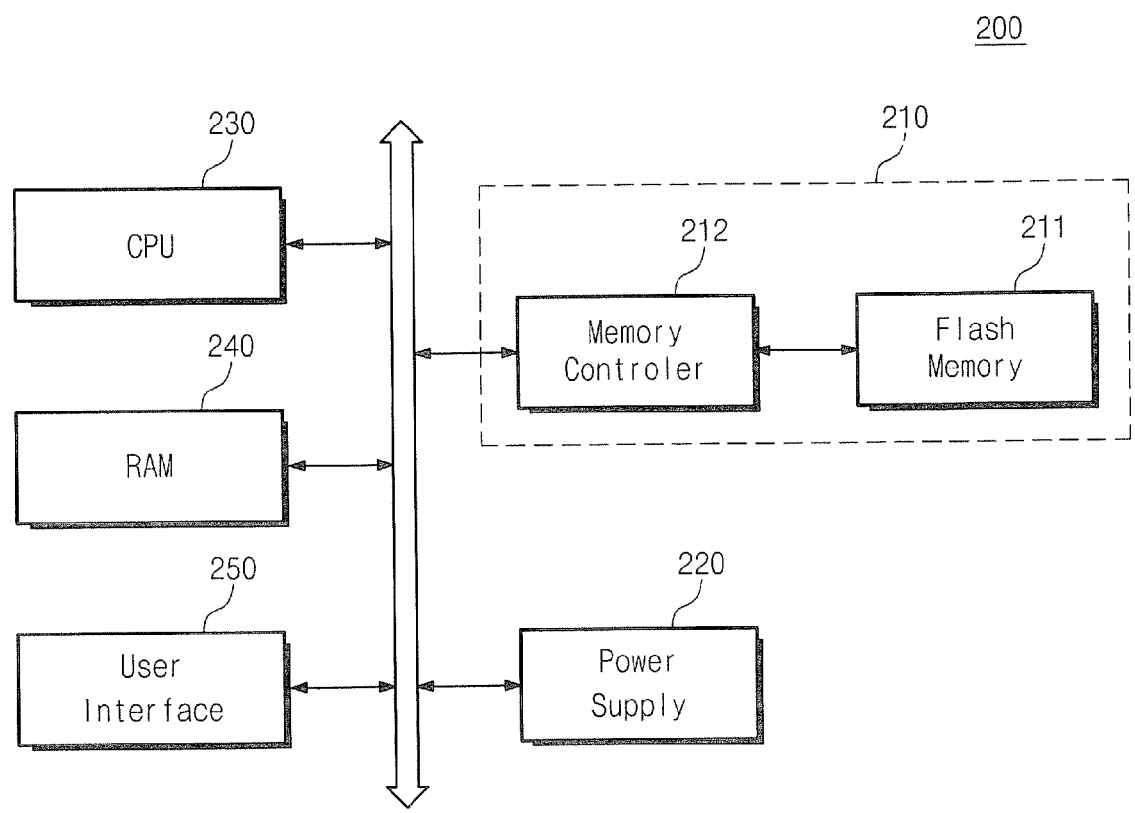
FIG. 26 is a block diagram of a memory system that includes a nonvolatile memory according to some embodiments of the present invention.

FIG. 26 is a memory system 200 that includes a nonvolatile memory, such as a flash memory, according to some embodiments of the present invention. As shown in FIG. 26, the memory system 200 comprises a memory card 210 comprising a memory controller 212 coupled to a flash memory 211, which may be embodied, for example, as the memory card 300 of FIG. 23. The memory system 200 further comprises a CPU 230, RAM 240, user interface 250, and power supply 220 that are coupled to each other and the memory card 210 by an address/data bus. The flash memory 211 may be embodied as discussed above with respect to FIGS. 4-24.

Memory devices, cards, and/or systems of FIGS. 4-26 may be embodied in, for example, a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, and/or a Universal Serial Bus (USB) flash drive device.

Moreover, memory devices, cards, and/or systems of FIGS. 4-26 may be embodied in, for example, a graphics card, a computer, a mobile terminal, a Personal Digital Assistant (PDA), a camera, a game console, an MP3 player, a television, a DVD player, a router, a GPS system, and/or a Camera Image Processor (CIS) and application chipset.

Memory devices, cards, and/or systems, according to some embodiments of the present invention, may be placed on a computer system via a variety of package types including Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink (Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), and/or Wafer-level Processed Package (WSP), among others. In some embodiments of the present invention, the memory cells of a flash memory device may be structured in various forms having charge storage layers. A charge storage architecture of the flash memory device may be implemented by including charge-trapping layers, stacked cell arrays where plural cell arrays are stacked, flash structures without source and drain regions, and/or pin-type flash structures, among others.

Many variations and modifications can be made to the embodiments without substantially departing from the principles of the present invention. All such variations and modifications are intended to be included herein within the scope of the present invention, as set forth in the following claims.

That which is claimed:

1. A method of operating a nonvolatile memory device, comprising:
    programming sample data in the memory device for verification using verify voltage levels derived from an ideal verify voltage Vv associated with a particular temperature range;
    performing read verify operations on the sample data using the verify voltage Vv associated with the temperature range; and determining a temperature compensation parameter Nc based on results of the read verify operations.

2. The method of claim 1, wherein programming the sample data comprises programming the sample data at N intervals corresponding to Vv through Vv−(N−1)Vd, where Vd corresponds to a shift in a threshold voltage Vth for the programmed sample data per unit of temperature.

3. The method of claim 2, wherein determining the temperature compensation parameter Nc comprises determining the temperature compensation parameter Nc based on numbers of the N intervals that pass and fail when performing the read verify operations on the sample data.

4. The method of claim 2, further comprising:
using a temperature compensated voltage Vtemp=Vorg+Nc*Vd as a program voltage, read voltage, and/or verify voltage in the nonvolatile memory device where Vorg is a voltage without temperature compensation associated with data to be programmed, read, and/or verified.

5. The method of claim 4, wherein the memory comprises a flash memory, the method further comprising:
programming a target page in the flash memory using a plurality of the temperature compensated voltages Vtemp.

6. The method of claim 4, wherein the memory comprises a flash memory, the method further comprising:
reading a target page in the flash memory using a plurality of the temperature compensated voltages Vtemp.

7. The method of claim 1, wherein the memory comprises a flash memory, the method further comprising:
reading a target page in the flash memory;
determining if errors in the target page are correctable; and
wherein programming the sample data, performing the read verify operations on the sample data, and determining the temperature compensation parameter are performed when the errors in the target page are not correctable.

8. The method of claim 1, wherein the memory comprises a flash memory.

9. The method of claim 8 wherein the flash memory comprises a NAND, NOR, or a One_NAND type flash memory.

10. The method of claim 1, wherein the memory device is embodied in a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, or a Universal Serial Bus (USB) flash drive device.

11. The method of claim 1, wherein the memory device is embodied in a graphics card, a computer, a mobile terminal, a Personal Digital Assistant (PDA), a camera, a game console, an MP3 player, a television, a DVD player, a router, or a GPS system.

12. A method of operating a nonvolatile memory system, comprising:
sending a sample page read command from a host to a memory device;
programming sample data in the memory device for verification using verify voltage levels derived from an ideal verify voltage Vv associated with a particular temperature range;
performing read verify operations on the sample data using the verify voltage Vv associated with the temperature range in the memory device;
providing results of the read verify operations to the host; and
determining a temperature compensation parameter Nc based on the results of the read verify operations at the host.

13. The method of claim 12, wherein programming the sample data comprises programming the sample data at N intervals corresponding to Vv through Vv−(N−1)Vd, where Vd corresponds to a shift in a threshold voltage Vth for the programmed sample data per unit of temperature.

14. The method of claim 13, further comprising:
communicating from the host to the memory device at least one temperature compensated voltage Vtemp=Vorg+Nc*Vd for use as a program voltage, read voltage, and/or verify voltage in the nonvolatile memory device where Vorg is a voltage without temperature compensation associated with data to be programmed, read, and/or verified.

15. The method of claim 14, wherein the memory comprises a flash memory, the method further comprising:
programming a target page in the flash memory using a plurality of the temperature compensated voltages Vtemp.

16. The method of claim 14, wherein the memory comprises a flash memory, the method further comprising:
reading a target page in the flash memory using a plurality of the temperature compensated voltages Vtemp.

17. The method of claim 14, wherein the at least one temperature compensated voltage value is stored in cells in the memory device.

18. The method of claim 14, wherein the at least one temperature compensated voltage value is stored in registers in the memory device.

19. The method of claim 12, wherein the memory comprises a flash memory, the method further comprising:
sending a target page read command from the host to the memory device;
reading the target page in the flash memory;
determining if errors in the target page are correctable; and
wherein programming the sample data, performing the read verify operations on the sample data, providing the results of the read verify operations to the host, and determining the temperature compensation parameter are performed when the errors in the target page are not correctable.

20. The method of claim 12, wherein the memory comprises a flash memory.

21. The method of claim 20 wherein the flash memory comprises a NAND, NOR, or a One_NAND type flash memory.

22. The method of claim 12, wherein the memory system is embodied in a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, or a Universal Serial Bus (USB) flash drive device.

23. The method of claim 12, wherein the memory system is embodied in a graphics card, a computer, a mobile terminal, a Personal Digital Assistant (PDA), a camera, a game console, an MP3 player, a television, a DVD player, a router, or a GPS system.

24. A method of operating a nonvolatile memory device, comprising:

programming N groups of sample data in the memory device for verification using verify voltage levels in the range of Vv through Vv+(N−1)Vd where Vd is a constant value;

performing read verify operations on the N groups of sample data using a verify voltage of (Vv+(N−1)Vd)/2; and determining a temperature compensation parameter Nc based on results of the read verify operations.

25. A method of operating a nonvolatile memory device, comprising:

programming N groups of sample data in the memory device for verification using verify voltage levels in the range of Vv through Vv+(N−1)Vd where Vd is a constant value;

performing read verify operations on the N groups of sample data using a verify voltage of Vv+Vm, where Vm is a constant value; and determining a temperature compensation parameter Nc based on a number of fail bits determined for each of the N groups.

* * * * *